US008276036B2

(12) United States Patent
Seki

(10) Patent No.: US 8,276,036 B2
(45) Date of Patent: Sep. 25, 2012

(54) CODING APPARATUS, CODING PROCESSING TARGET SEQUENCE FORMING METHOD AND VITERBI DECODING APPARATUS

(75) Inventor: Yuta Seki, Kanagawa (JP)

(73) Assignee: Panasonic Corporation, Osaka (JP)

( * ) Notice: Subject to any disclaimer, the term of this patent is extended or adjusted under 35 U.S.C. 154(b) by 694 days.

(21) Appl. No.: 12/479,572

(22) Filed: Jun. 5, 2009

(65) Prior Publication Data
US 2009/0307560 A1 Dec. 10, 2009

(30) Foreign Application Priority Data
Jun. 5, 2008 (JP) .................................. 2008-148225

(51) Int. Cl.
*H04L 1/16* (2006.01)
(52) U.S. Cl. ...................................................... 714/751
(58) Field of Classification Search .................. 714/701, 714/792, 795, 751
See application file for complete search history.

(56) References Cited

U.S. PATENT DOCUMENTS

| | | | | |
|---|---|---|---|---|
| 5,182,753 A * | 1/1993 | Dahlin et al. | ............... | 714/749 |
| 5,369,671 A * | 11/1994 | Yehushua et al. | ............... | 375/341 |
| 5,404,355 A * | 4/1995 | Raith | ............... | 370/311 |
| 5,577,053 A * | 11/1996 | Dent | ............... | 714/755 |
| 5,910,182 A * | 6/1999 | Dent et al. | ............... | 714/786 |
| 5,920,597 A | 7/1999 | Khayrallah | | |
| 5,991,635 A * | 11/1999 | Dent et al. | ............... | 455/517 |
| 6,498,936 B1 * | 12/2002 | Raith | ............... | 455/466 |
| 6,973,610 B1 * | 12/2005 | Xu | ............... | 714/752 |
| 7,240,270 B2 * | 7/2007 | Bellier et al. | ............... | 714/746 |
| 7,512,870 B2 * | 3/2009 | Hedayat et al. | ............... | 714/795 |
| 7,693,110 B2 * | 4/2010 | Love et al. | ............... | 370/332 |
| 7,940,795 B2 * | 5/2011 | Frederiksen et al. | ......... | 370/468 |
| 2009/0041166 A1 | 2/2009 | Patel | | |

FOREIGN PATENT DOCUMENTS

| | | |
|---|---|---|
| JP | 2923430 A | 7/1999 |
| JP | 2001-506811 | 5/2001 |
| JP | 2001-197034 | 7/2001 |
| JP | 07-030439 A | 1/2005 |

(Continued)

OTHER PUBLICATIONS

R1-073033, Ericsson, "Complexity and Performance Improvement for Convolutional Coding," 3GPP TSG-RAN WG1#49bis, Orlando, Florida, Jun. 25-29, 2007.

(Continued)

*Primary Examiner* — Stephen M Baker
(74) *Attorney, Agent, or Firm* — Dickinson Wright PLLC

(57) ABSTRACT

The coding apparatus, coding processing target sequence forming method and Viterbi decoding apparatus of the present invention can realize low delay processing with a minimum number of repetitive processing and suppress the degradation of the accuracy of decoding at the ends of a decoded sequence due to truncation error. In the coding apparatus mounted on the transmitting apparatus (100), a control information rearranging section (130) receives as input a control information sequence, in which a plurality of control information blocks are arranged in a predetermined order, and forms a coding processing target sequence by rearranging the order of the plurality of control information blocks to form an assembled sequence grouping control information blocks comprised of predictable bit sequences in the plurality of control information blocks, and to allocate the assembled sequence to a predetermined position in the control information sequence. Further, an encoding section (140) encodes the coding target sequence using the tail-biting convolutional coding scheme.

12 Claims, 8 Drawing Sheets

FOREIGN PATENT DOCUMENTS

WO      2008/027613      3/2008

OTHER PUBLICATIONS

Shao, R.Y., et al., Two Decoding Algorithms for Tailbiting Codes, IEEE Transactions on Communications, 51(10):1658-1665, Oct. 2003.

Wilkie, B. and B. Cowie, "Viterbi Decoder Block Decoding—Trellis Termination and Tail Biting," XILINX, XAPP551 (1.0): 1-12, Feb. 14, 2005.

Extended European Search Report dated Nov. 3, 2011.

Japanese Office Action dated Nov. 29, 2011.

T. Hindelang, et al., "A Re-Investigation of Scalar Quantization for Mobile Speech Transmission," IEEE Vehicular Technology Conference, XP000988445, Sep. 24-28, 2000, pp. 2459-2466.

A. Subramaniam, et al., "Joint Source-Channel Decoding of Speech Spectrum Parameters over an AWGN Channel using Gaussian Mixture Models," IEEE International Conference on Communications, vol. 5, XP010712285, Jun. 20-24, 2004, pp. 2847-2851.

3GPP TS 36.212 V8.1.0, "3rd Generation Partnership Project; Technical Specification Group Radio Access Network; Evolved Universal Terrestrial Radio Access (E-UTRA); Multiplexing and channel coding (Release 8)," XP050377547, Nov. 2007, pp. 1-39.

C. Weib, et al., "Turbo Decoding with Tail-Biting Trellises," Proceedings of the International Symposium on Signals, Systems, and Electronics 1998, Sep. 1998, pp. 343-348.

* cited by examiner

US 8,276,036 B2

CODING APPARATUS, CODING PROCESSING TARGET SEQUENCE FORMING METHOD AND VITERBI DECODING APPARATUS

CROSS REFERENCE TO RELATED APPLICATIONS

The disclosure of Japanese Patent Application No. 2008-148225, filed on Jun. 5, 2008, including the specification, drawings and abstract, is incorporated herein by reference in its entirety.

TECHNICAL FIELD

The present invention relates to a coding apparatus, coding processing target sequence forming method, and Viterbi decoding apparatus.

BACKGROUND ART

Upon transmitting an information signal from a transmitter to a receiver via a channel, the information signal may be transmitted as error information due to channel distortion and the influence of noise and so on.

To reduce such errors, the transmitter performs coding processing and the receiver performs decoding processing. Here, as a code that can be processed in a relatively simple manner and that enables efficient error correction, a convolutional code is known in particular.

FIG. 1 illustrates a configuration example of a convolutional encoder. The constraint length K of the convolutional encoder shown in FIG. 1 is 7, and this encoder assumes $2^{K-1}=2^6$ possible transition states.

Here, "termination" and "tail-biting" are known as a method of dividing an information signal sequence into a plurality of coding blocks each comprised of a predetermined number of bits and transmitting these coding blocks individually.

The termination method assumes that the initial state of the encoder is known (generally, a signal sequence comprised of K−1 zero-value signals). This is equivalent to attaching a known signal to the heads of the above-noted coding blocks that are inputted in the encoder. Further, the termination method attaches a known signal (which is generally a signal sequence comprised of K−1 zero-value signals) to the tail ends of the above-noted coding blocks inputted in the encoder, so that it is possible to uniquely determine the state of the encoder at the time when coding processing of the coding blocks inputted in the encoder is finished. Therefore, if the decoder knows the above-noted known signals in advance, the decoder can identify the initial state and the end state corresponding to the coding blocks included in the received signal.

On the other hand, the tail-biting method assumes that a sequence comprised of the initial values of a plurality of registers included in the encoder is the same as the signal sequence which is comprised of K−1 signals and attached to the tail ends of coding blocks. By this means, the initial state and the end state of the encoder are the same. However, unlike the termination method, the initial state (end state) is not always fixed, and, consequently, the decoder cannot predict in which state the initial state (end state) is.

Here, the state transition of a convolutional encoder is represented by a trellis diagram. In the case of the tail-biting method, the initial state and the end state of an encoder are the same, and, consequently, the trellis diagram is assumed to be cyclic as shown in FIG. 2.

As suboptimal maximum-likelihood decoding of the convolutional code described above, the Viterbi algorithm is widely known.

This Viterbi algorithm will be explained below. Further, $S_0, S_1, \ldots, S_{L-1}$ are used as the states of an encoder. Further, in the trellis diagram, if there is a branch from the state $S_i$ (i=0, ..., M−1) at point t to the state $S_j$ (j=0, ..., L−1) at point t+1, this branch is represented by $b_{ij}$. Further, paths that survive and connect between states at points in the trellis diagram will be referred to as "surviving paths." Further, the surviving path to the state $S_i$ at point t is represented by $p_{i,t}$ and the metric of the surviving path is represented by $\lambda_{i,t}$.

In this case, the basic operations of the Viterbi algorithm will be described as follows.

(1) In the trellis diagram, with respect to received sequence $y_t$, the branch metrics $\lambda(y_t, b_{ij})$ of all branches $b_{ij}$ from state $S_i$ at point t to state $S_j$ at point t+1 are calculated. (2) The branch metrics $\lambda(y_t, b_{ij})$ of all branches $b_{ij}$ and the metrics $\lambda_{i,t}$ of surviving paths $p_{i,t}$ of the state $S_i$ at point t connecting to branches $b_{ij}$, are added. (3) The sums calculated in (2) about all paths connecting to the state $S_j$ at point t+1 are compared, and the combination of the surviving path $p_{i,t}$ and branch $b_{ij}$ are found where the sum is minimum. Here, the path connecting $p_{i,t}$ and $b_{ij}$ is the surviving path $p_{j,t+1}$ of $S_j$. Further, the surviving path metric $p_{j,t+1}$ of the surviving path $p_{j,t+1}$ of $S_j$ is calculated by $\lambda_{i,t}+\lambda(y_t, b_{ij})$. The above-noted processing in (3) is performed for all of states $S_j$ at point t+1.

Here, the above-described addition in (2) and the above-described comparison of metrics and calculations to select a path where a minimum value is acquired in (3), are collectively referred to as "ACS (Add Compare Select) calculation."

Next, when the ACS calculation is finished, it is possible to acquire the decoding result by tracing back the surviving paths. This processing of tracing the surviving paths is called "traceback."

Here, generally, a codeword transmitted by the tail-biting method requires a greater amount of calculations and longer processing time on the receiving side than a codeword transmitted by the termination method. This is because, as described above, the decoder cannot predict the initial state (end state) by the tail-biting method.

Therefore, upon adopting the tail-biting method, the decoder is demanded to reduce the amount of processing.

Next, a conventional decoding method for a convolutional codeword transmitted by the tail-biting method will be explained.

Non-Patent Document 1 discloses performing the decoding processing shown in FIG. 3. To be more specific, the construction of trellis diagram by ACS calculation is repeated a plurality of times (three times in FIG. 3) with respect to coding block 0 ("TB block 0" in FIG. 3), which is a received packet. Here, upon consecutively repeating ACS calculation with respect to a received packet, a feature of the tail-biting is utilized that the initial state and the end state of an encoder are the same.

Further, a traceback is performed for the trellis diagram acquired by repeating the ACS calculation a plurality of times. In this traceback, a training period is provided. Although training is the same as traceback in tracking back the surviving paths, the training differs from traceback in not using the tracking result as a decoding result (i.e., in not outputting the tracking result as a decoding result).

After this training processing, traceback processing is performed, and the processing result is used (outputted) as a decoding result.

Further, Non-Patent document 2, Non-Patent Document 3 and Patent Document 1 disclose performing the processing shown in FIG. 4. To be more specific, a tail-biting check is performed at every timing ACS calculation is performed one time for a received packet (i.e. one loop of coding block length). The tail-biting check refers to the processing of tracking surviving paths like a traceback and checking whether the initial state and the end state match. Here, according to the result of the tail-biting check, the decoding result is outputted if the initial state and the end state match, and the ACS calculation is repeated if the initial state and the end state do not match.

Thus, conventional Viterbi decoding processing utilizes the feature that the initial state and the end state of an encoder adopting the tail-biting method are equivalent, thereby performing decoding processing of a received packet using received packet as the ACS calculation repeating unit.

CITATION LIST

Patent Literature

Patent Document 1: Japanese Patent Application No. 2923430, "Operational Method of Circular Viterbi Decoder"

Non Patent Literature

Non-Patent Document 1: Bill Wilkie and Beth Cowie, "Viterbi Decoder Block Decoding—Trellis Termination and Tail Biting", XAPP551 (1.0) Feb. 14, 2005
Non-Patent Document 2: R. Y. Shao, S. Lin and M. Fossorier, "Two decoding algorithms for tail biting codes", IEEE Trans. on Comm., vol. 51, no. 10, pp. 1658-1665, October 2003
Non-Patent Document 3: R1-073033, Ericsson, "Complexity and Performance Improvement for Convolutional Coding", 3GPP TSG-RAN WG1#49bis, Orlando, USA, Jun. 25-29, 2007

SUMMARY OF INVENTION

Technical Problem

However, repetitive processing leads to increased processing delay. Therefore, this increased processing delay is a problem in realizing a low delay communication system in particular.

Further, it is known that, if the above-noted conventional technique uses a result acquired by one ACS calculation and traceback as a decoding result, without performing repetitive processing, the error rate increases in the vicinity of both ends (i.e. the head part and tail end part) of the decoded sequence due to the truncation error.

It is therefore an object of the present invention to provide a coding apparatus, coding processing target sequence forming method and Viterbi decoding apparatus that realize low delay processing with a minimum number of repetitive processing and suppress the degradation of the accuracy of decoding at the both ends of a decoded sequence due to the truncation error.

DESCRIPTION OF EMBODIMENTS

The present inventor has found that a control information sequence includes a plurality of control information blocks and that there are control information blocks comprised of bit sequences that can be predicted on the receiving side.

Further, the present inventor has found that, even in a case where a control information sequence is encoded and transmitted by the tail-biting coding scheme, it is possible to limit the number of possible states in an encoder by rearranging the control information sequence. Further, the present inventor has found that, by limiting the number of possible states in an encoder, it is possible to realize low delay processing with a reduced amount of processing on the receiving side and prevent the degradation of the accuracy of decoding due to truncation error, and has arrived at the present invention.

An embodiment of the present invention will be explained below in detail with reference to the accompanying drawings.

Figure 1:
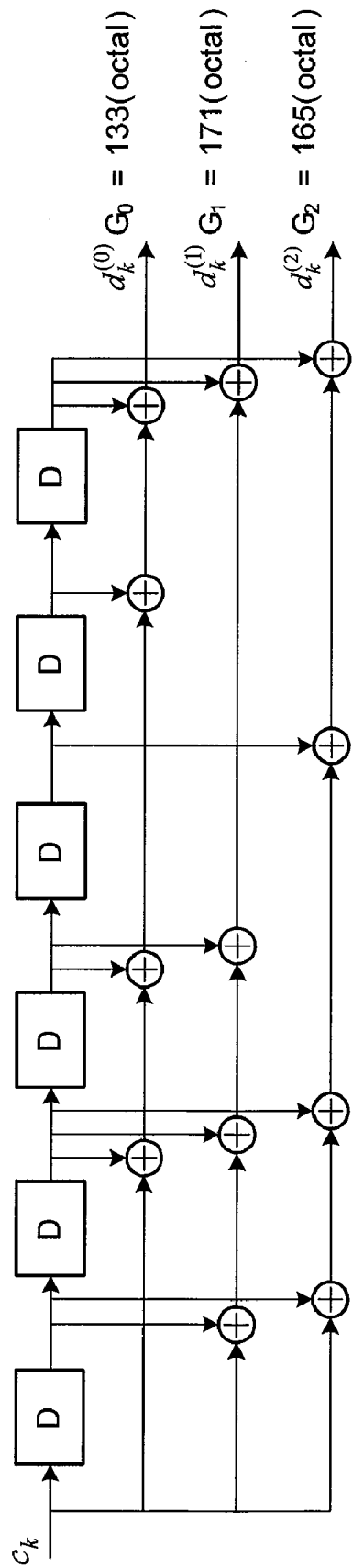
FIG. 1 illustrates a configuration example of a conventional convolutional encoder.
Figure 2:
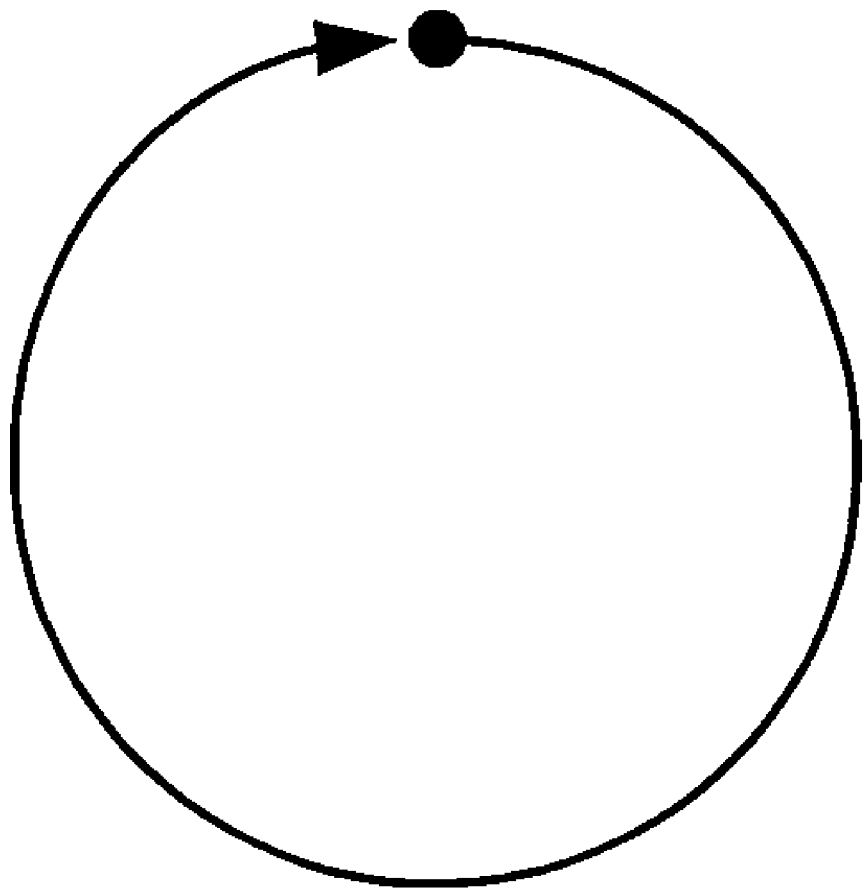
FIG. 2 illustrates a trellis diagram of a convolutional encoder where the tail-biting method is adopted.
Figure 3:
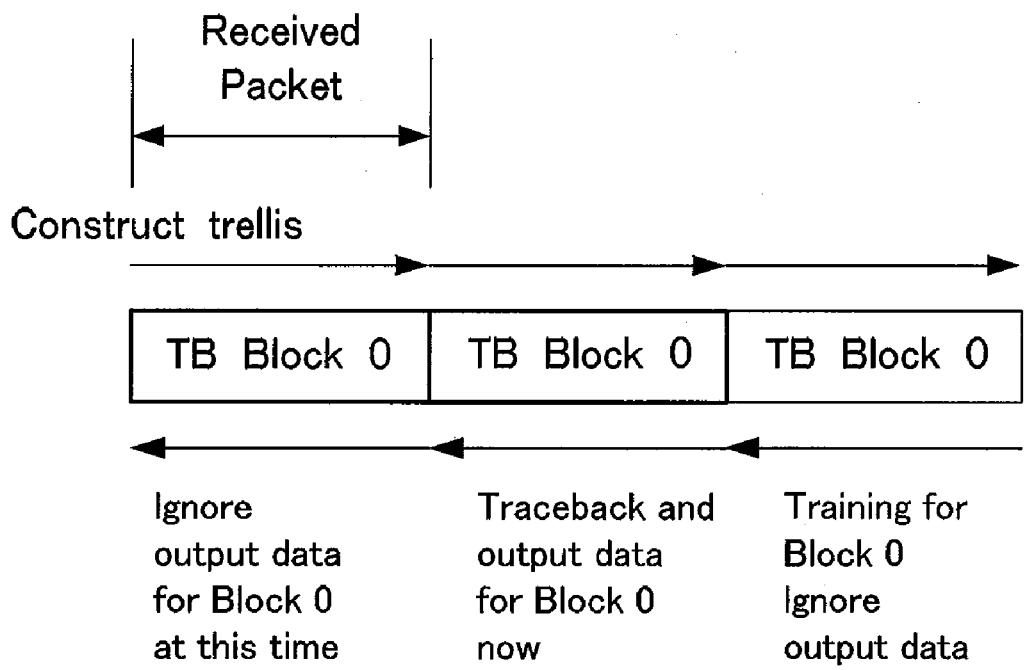
FIG. 3 illustrates a conventional decoding method for a convolutional codeword transmitted in the tail-biting method.
Figure 4:
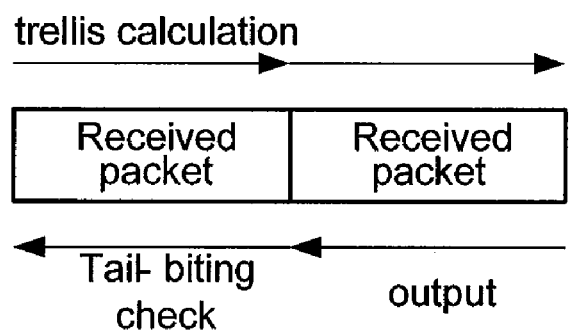
FIG. 4 illustrates a conventional decoding method for a convolutional codeword transmitted in the tail-biting method.
Figure 5:
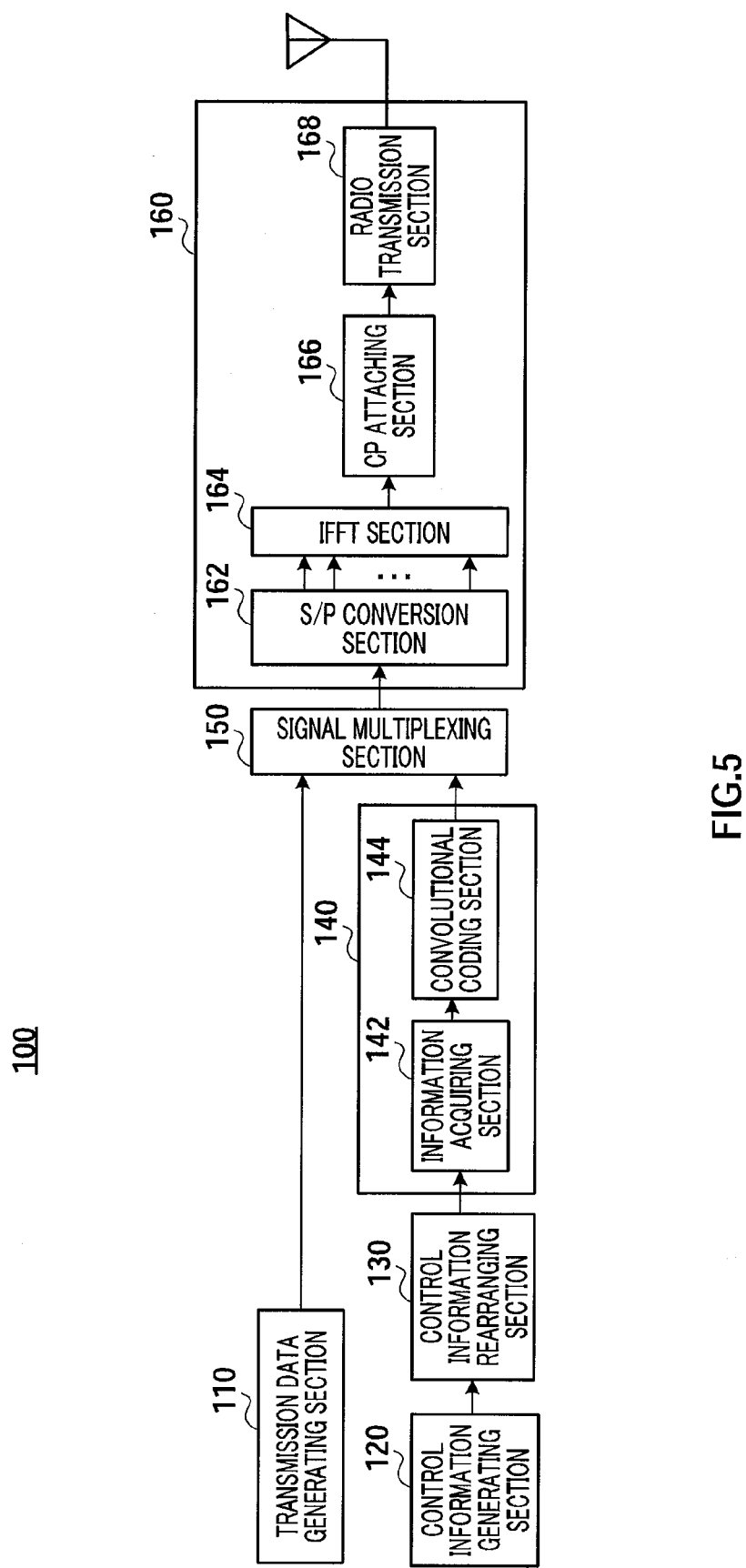
FIG. 5 is a block diagram showing the configuration of a transmitting apparatus according to an embodiment of the present invention.

As shown in FIG. 5, transmitting apparatus 100 of the present embodiment is provided with transmission data generating section 110, control information generating section 120, control information rearranging section 130, encoding section 140, signal multiplexing section 150 and transmitting section 160.

Transmission data generating section 110 generates a transmission data sequence and outputs the transmission data sequence to signal multiplexing section 150.

Control information generating section 120 generates a control information sequence and outputs the control information sequence to control information rearranging section 130. Here, the control information sequence refers to the coding processing unit in encoding section 140, which will be described later. Further, the control information sequence includes a plurality of control information blocks. The order of the control information blocks in the control information sequence is determined by communication standards and so on.

Figure 6:
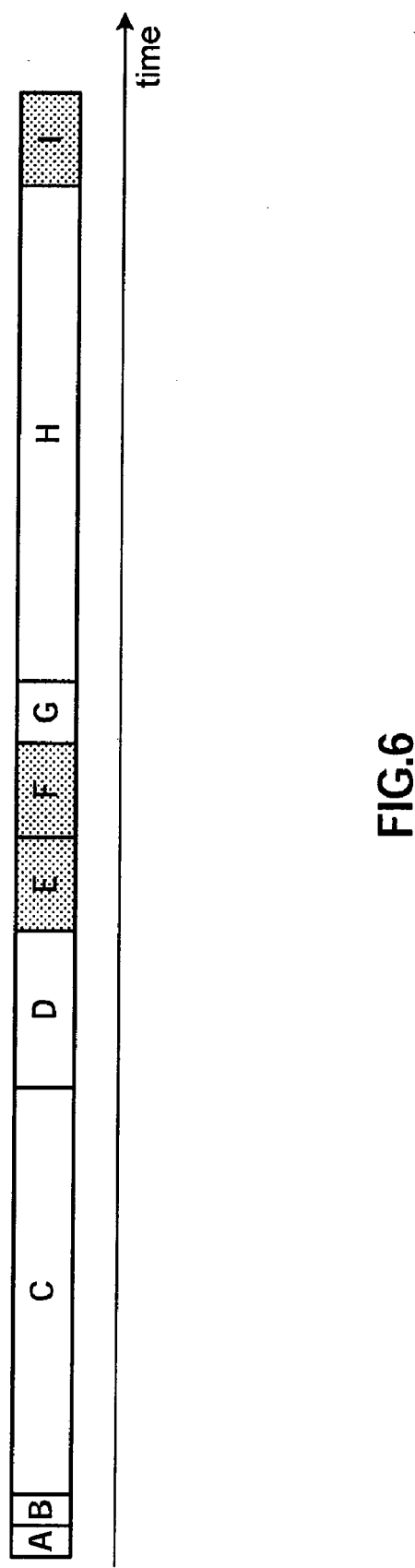
FIG. 6 illustrates a format example of a control information sequence.

FIG. 6 illustrates a format example of a control information sequence. Here, FIG. 6 illustrates a downlink control information sequence. In FIG. 6, the horizontal axis represents the time axis.

FIG. 6 illustrates a state where: format identification information (flag for format differentiation) is placed in period A; a distributed transmission flag is placed in period B; information about resource block assignment is placed in period C; and transport format identification information is placed in period D.

Further, FIG. 6 illustrates a state where: a hybrid automatic repeat request ("HARQ") process number is placed in period E; a retransmission sequence number is placed in period E; a TPC (Transfer Protocol Command) is placed in period G; a cyclic redundancy check (CRC) code (used with UE ID) is placed in period H; and padding bits that are inserted to make the number of bits included in the control information sequence suit the coding processing unit, are placed in period I. Hereinafter, the control information blocks may be referred to as control blocks A to I in association with the periods for allocation in FIG. 6.

Here, the format of a control information sequence is not limited to the above example, and any one of the following Format 0 to 3A can be used. Format 0: Flag for form at 0/form at 1A differentiation, Hopping flag, Resource block assignment and hopping resource allocation, Modulation and cording scheme and redundancy version, New data indicator, TPC command, Cyclic shift, UL index, Downlink Assignment Index (DAI), CQI request. Format 1: Resource allocation header, Resource block assignment, Modulation and cording scheme, HARQ process number, New data indicator, Redundancy version, TPC command, Downlink Assignment Index. Format 1A: Flag for form at 0/form at 1A differentiation, Localized/Distributed VRB assignment flag, Resource block assignment, Modulation and cording scheme, HARQ process number, New data indicator, Redundancy version, TPC command, Downlink Assignment Index. Format 1B: Localized/Distributed VRB assignment flag, Resource block assignment, Modulation and cording scheme, HARQ process number, New data indicator, Redundancy version, TPC command, Downlink Assignment Index, TPMI information for precoding, PMI confirmation for precoding. Format 1C: 1 bit indicates the gap value, Resource block assignment, Transport block size index. Format 1D: Localized/Distributed VRB assignment flag, Resource block assignment, Modulation and cording scheme, HARQ process number, New data indicator, Redundancy version, TPC command, Downlink Assignment Index, TPMI information for preceding, Downlink power offset. Format 2: Resource allocation header, Resource block assignment, TPC command, Downlink Assignment Index, HARQ process number, Transport block to codeword swap flag. Format 2A: Resource allocation header, Resource block assignment, TPC command, Downlink Assignment Index, HARQ process number, Transport block to codeword swap flag. Format 3: TPC command number 1, TPC command number 2, . . . , TPC command number N. Format 3A: TPC command number 1, TPC command number 2, . . . , TPC command number M.

Control information rearranging section 130 rearranges the inputted control information sequence. By this rearrangement processing, control information rearranging section 130 forms an assembled sequence grouping control information blocks comprised of bit sequences that can be predicted on the receiving side, and allocates this assembled sequence in a predetermined position in the control information sequence. Here, the control information blocks in the assembled sequence are allocated in the tail end of the control information sequence. Further, for example, the control information blocks in the assembled sequence are arranged in such an order that the accuracy of prediction with respect to bit sequences forming the control information blocks increases. Further, outside the assembled sequence, for example, the control information block of the highest importance (which is highly demanded to be transmitted without error) is allocated to the adjacency of the control information block of the lowest accuracy of prediction in the assembled sequence. Here, although allocation is determined per control information block, it is equally possible to determine allocation per bit.

Thus, the control information sequence is rearranged to form a coding target sequence, and this coding target sequence is inputted in encoding section 140.

Here, bits that can be predicted on the receiving side (i.e. predictable bits) can be classified into the four main broad categories shown below.
(1) known signal
(2) unassigned bit pattern
(3) information correlated with past information
(4) information about a signal that occurs in uneven probabilities Bits that can be predicted on the receiving side will be explained below in detail.
(a) Padding Bit (Known Signal)
Padding bits refers to a known bit sequence attached to a control information sequence to make the number of bits included in the control information sequence suit the coding processing unit. Therefore, the receiving side can identify this bit sequence before decoding.
(b) Unassigned Bit Pattern
If the number of information patterns to report to the receiving side with a control information block is smaller than the number of bit sequence patterns that can be represented with the number of bits assigned to the control information block, there are unused bit sequence patterns that are not used for information transmission. Upon decoding, the receiving side can predict that candidates of the bit sequence patterns included in this control information block are the bit sequence patterns other than the unused bit sequence patterns.

For example, a case is possible where, in a control information block assigned three bits, the used bit sequence states are 000, 001, 010, 011 and 100, and the unused (N/A) bit sequence states are 110 and 111. The unassigned patterns have no values, so that the receiving side can limit bit sequence patterns of the control information block. To be more specific, in a case where two bits are assigned to a control information block representing modulation scheme identification information, and QPSK (00), 16QAM (01) and 64QAM (10) are adopted as modulation schemes, bit sequence pattern 11 is unassigned.
(c) Information Correlated with Past Information
For example, there is an NDI (New Data Indicator) associated with retransmission sequence numbers. This NDI refers to information showing whether a transmission data sequence is new or retransmission. The receiving side stores whether transmission of a date sequence that was previously received succeeds or fails (i.e., whether ACK is returned or NACK is returned to the transmitting side), so that it is possible to estimate whether a data sequence that is currently received is new or retransmission, that is, it is possible to estimate an NDI. That is, a control information block representing an NDI is comprised of a bit sequence that can be predicted on the receiving side.
(d) RV (Redundancy Version) Information (which is Correlated with Past Information)
RV is uniquely determined based on the number of retransmissions. Therefore, the receiving side stores in advance the number of times retransmission data is retransmitted, so that it is possible to estimate the RV of the retransmission data that is currently received.
(e) HARQ Process Number (which is Information Correlated with Past Information)
A HARQ process number refers to a number assigned per basic block in HARQ. In a case where the receiving side receives a transmission data sequence assigned a certain HARQ process number and returns a NACK to the transmitting side, the receiving side does not receive transmission data sequence for retransmission having that HARQ process number until the RTT (Round Trip Time) elapses from the time the NACK was returned. That is, the HARQ process number received between the current time and the RTT before the current time, cannot be the HARQ process number of the transmission data sequence to be received this time. Thus, the HARQ process number is comprised of a bit sequence that can be predicted on the receiving side.

(f) Transmission Format Identification Information (which is Correlated with Past Information)

Transmission format identification information refers to information representing the payload size of the transmission data sequence. The transmission format identification information of the retransmission data sequence is always comprised of a bit sequence in which all forming bits are known constant. Therefore, except for the initial transmission, the receiving side can identify transmission format identification information.

(g) ACK/NACK Identification Information (i.e. Information about a Signal that Occurs in Uneven Probabilities)

Generally, a system adopting ARQ is designed such that ACK is provided approximately 90 percent of the time. Therefore, the receiving side receiving ACK/NACK identification information can predict that ACK is provided oftentimes.

Referring back to FIG. 5, encoding section 140 encodes the coding target sequence using the tail-biting convolutional coding scheme. Encoding section 140 is provided with information acquiring section 142 and convolutional coding section 144.

Information acquiring section 142 acquires the coding target sequence outputted from information rearranging section 130.

Convolutional coding section 144 encodes the coding target sequence acquired in information acquiring section 142 using the tail-biting convolutional coding scheme, and outputs the resulting codeword to signal multiplexing section 150.

Signal multiplexing section 150 multiplexes the transmission data sequence generated in transmission data generating section 110 and the codeword acquired in coding section 140, and outputs the resulting multiplexed signal to transmitting section 160.

Transmitting section 160 transmits the multiplexed signal from signal multiplexing section 150. Here, transmitting section 160 is provided with serial/parallel (S/P) conversion section 162, IFFT (Inverse Fast Fourier Transform) section 164, CP (Cyclic Prefix) attaching section 166 and radio transmission section 168, and forms OFDM signals with multiplexed signals and transmits the OFDM signals.

S/P conversion section 162 converts the multiplexed signal from signal multiplexing section 150 into a plurality of parallel signals.

IFFT section 164 performs an IFFT of the plurality of parallel signals acquired in S/P conversion section 162 and forms an OFDM signal.

CP attaching section 166 attaches a CP to the OFDM signal acquired in IFFT section 164.

Radio transmission section 168 performs wireless processing (such as D/A conversion and up-conversion) of the OFDM signal attached a CP, and transmits the resulting radio signal via an antenna.

Figure 7:
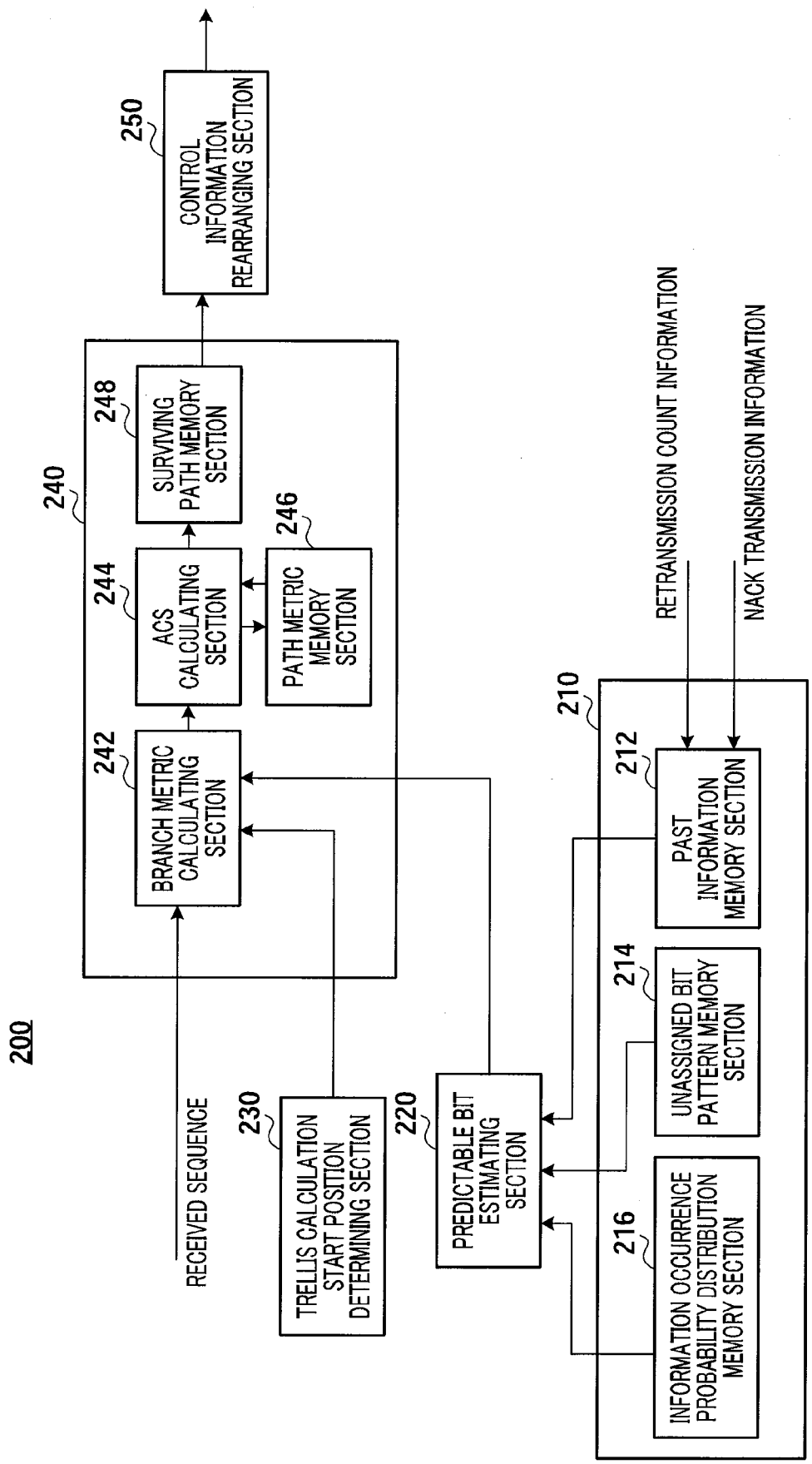
FIG. 7 illustrates rearranging processing in a control information rearranging section.

As shown in FIG. 7, receiving apparatus according to the present embodiment is provided with bit estimation material storage section 210, predictable bit estimating section 220, trellis calculation start position determining section 230, surviving path calculation processing section 240 and control information rearranging section 250.

Bit estimation material storage section 210 stores bit estimation material information, which is used in bit estimation processing in predictable bit estimating section 220.

Here, bit estimation material storage section 210 is provided with past information memory section 212, unassigned bit pattern memory section 214 and information occurrence probability distribution memory section 216.

Past information memory section 212 memorizes, for example, retransmission count information that represents the number of retransmissions increased every time the transmission data sequence is retransmitted and that is managed on a per transmission data sequence basis, and NACK transmission information (including the HARQ process number and transmission timing information).

Unassigned bit pattern memory section 214 memorizes, for example, unassigned bit pattern information (i.e. unassigned bit patterns in control information blocks).

Information occurrence probability distribution memory section 216 memorizes information about the distribution of the probabilities of occurrence of information that occurs in uneven probabilities such as ACK and NACK.

Predictable bit estimating section 220 estimates the bit values of an assembled data sequence included in the received coding data sequence and comprised of predictable bit sequences, based on the bit estimation material information stored in bit estimation material storage section 210.

The system (i.e. communication system including transmitting apparatus 100 and receiving apparatus 200) determines in advance the position of the assembled sequence to allocate in the control information sequence, and, consequently, trellis calculation start position determining section 230 outputs information about the position of the assembled sequence to allocate, to surviving path calculation processing section 240 as trellis calculation start position information.

Surviving path calculation processing section 240 calculates surviving paths by ACS calculation of transition states other than the transition states matching the bit values estimated in predictable bit estimating section 220 on the trellis diagram. Surviving path calculation processing section 240 performs ACS calculation by setting the start point at the point corresponding to the assembled data sequence on the trellis diagram, based on the trellis calculation start position information.

Here, surviving path calculation processing section 240 is provided with branch metric calculating section 242, ACS calculating section 244, path metric memory section 246 and surviving path memory section 248.

Branch metric calculating section 242 calculates branch metrics using the received sequence received as input, and outputs the calculated branch metrics to ACS calculating section 244. Here, the received sequence includes the control information sequence transmitted from transmitting apparatus 100.

In the decoding processing of the input control information sequence, the transition states at the point corresponding to the assembled data sequence are limited based on the bit values estimated in predictable bit estimating section 220, so that branch metric calculating section 242 calculates only the branch metrics associated with the possible transition states at the point.

ACS calculating section 244 performs ACS calculation using the branch metrics calculated in branch metric calculating section 242. The path metrics of the surviving paths acquired at each point are temporarily held in path metric memory section 246. ACS calculating section 244 calculates the path metrics of the current surviving paths using the current branch metrics of the current surviving paths to be calculated and the path metrics calculated at the point previous to the current point and held in path metric memory section 246. Further, ACS calculating section 244 makes path metric memory section 246 hold the calculated path metrics of the surviving paths, and outputs the surviving paths and information associated with the surviving paths (i.e. branch metrics and path metrics of the surviving paths), to surviving path memory section 248.

Surviving path memory section 248 stores the surviving paths calculated in ACS calculating section 244.

Control information rearranging section 250 performs rearrangement processing for the path of the maximum likelihood amongst the surviving paths held in surviving path memory section 248 such that the order of the control information sequence rearranged in control information rearranging section 130 is rearranged to the original order.

The operations of transmitting apparatus 100 and receiving apparatus 200 employing the above-noted configuration will be explained.

In transmitting apparatus 100, control information generating section 120 generates a control information sequence. For example, as shown in FIG. 6, this control information sequence is formed such that control information blocks comprised of "bit sequences that can be predicted on the receiving side" are scattered. Allocation of these control information blocks is determined by communication standards and so on.

The control information sequence generated in control information generating section 120 is rearranged in control information rearranging section 130.

Figure 8:
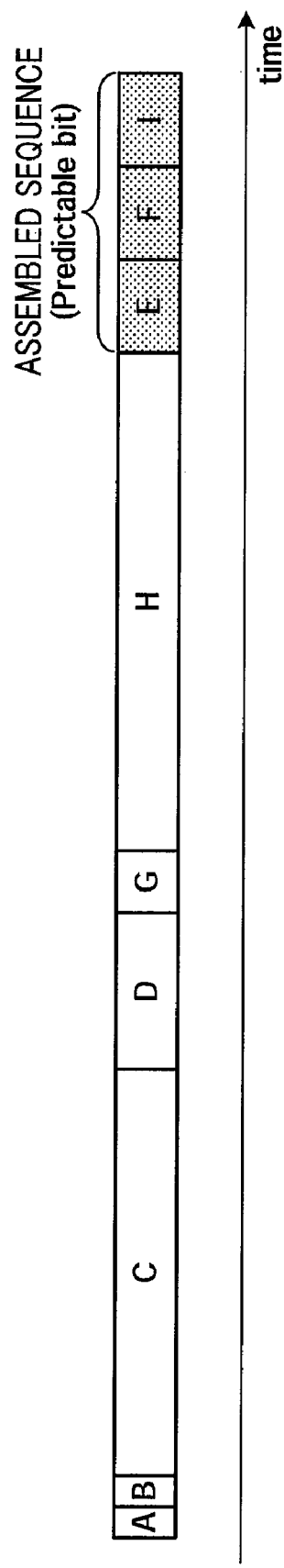
FIG. 8 illustrates a format example of a control information sequence.

FIG. 8 illustrates rearrangement processing in control information rearranging section 130.

As shown in FIG. 8, "control information blocks comprised of bit sequences that can be predicted on the receiving side" are gathered into one block in control information rearranging section 130. This one block is the assembled sequence and corresponds to a group of the control information blocks allocated in periods E, F and I in FIG. 8.

Further, the control information blocks in the assembled sequence are arranged in such an order that the accuracy of prediction with respect to the bit sequences forming the control information blocks increases. That is, in FIG. 8, the accuracy of prediction increases in ascending order of E, F and I or in ascending order of I, F and E. Whether these control information blocks are arranged in ascending order along the positive direction in the time domain or along the negative direction in the time domain, is determined based on the direction in which receiving apparatus 200 performs ACS calculation on the trellis. Here, a case will be explained where the accuracy of prediction increases in ascending order of E, F and I.

Further, although a case has been described with FIG. 8 where the order of the control information blocks (i.e. A, B, C, D, G and H) outside the assembled sequence are not rearranged, these control information blocks can be rearranged. In this case, it is preferable to allocate the control information block of the highest importance (corresponding to control information block H in FIG. 8) next to the control information block of the lowest accuracy of prediction (corresponding to control information block E in FIG. 8) in the control information blocks included in the assembled sequence. Further, it is equally possible to allocate the control information blocks such that the importance of a control information block is lower when the control information block becomes apart from the control information block of the lowest accuracy of prediction (corresponding to control information block E in FIG. 8) in the control information blocks included in the assembled sequence.

Further, in a case where control information block I has the lowest accuracy of prediction in the control information blocks included in the assembled sequence, "adjacency of the control information block of the lowest accuracy of prediction in the control information blocks included in the assembled sequence (corresponding to control information block E in FIG. 8)" is equivalent to the head position of the control information sequence. That is, in this case, the importance of control information block A is the highest.

The control information sequence rearranged as above is encoded using the tail-biting coding scheme in encoding section 140, and multiplexed with the transmission data sequence in signal multiplexing section 150. Thus, the resulting multiplexed signal is transmitted to receiving apparatus 200 via transmitting section 160.

A radio signal transmitted from transmitting apparatus 100 is received in receiving apparatus 200.

The reception sequence is inputted in surviving path calculation processing section 240. Surviving path calculation processing section 240 calculates surviving paths by limiting the transition states on the trellis diagram using the bit values estimated in predictable bit estimating section 220 and then performing ACS calculation.

The start point of this ACS calculation is determined based on trellis calculation start position information. To be more specific, the point corresponding to the control information block of the highest accuracy of prediction in the assembled sequence is set the start point. That is, the point at which the possible transition states are the most limited (i.e. the point at which the number of transition state candidates is the minimum) is set the start point. Further, surviving path calculation processing section 240 sequentially performs ACS calculation at points corresponding to the control information blocks in the assembled sequence, and then performs ACS calculation at points corresponding to control information blocks outside the assembled sequence.

Figure 9:
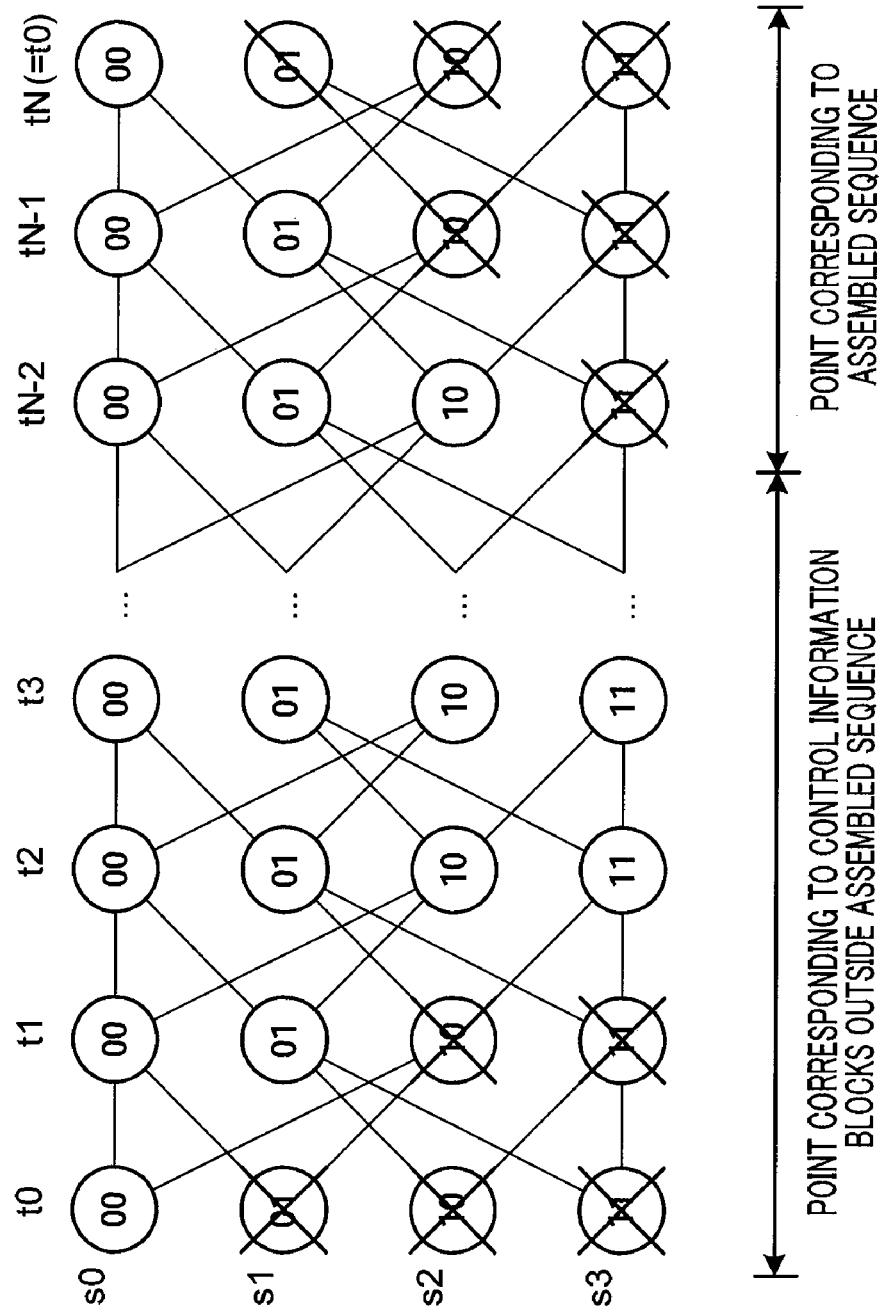
FIG. 9 illustrates ACS calculation processing in a surviving path calculating processing section.

FIG. 9 illustrates ACS calculation processing in surviving path calculation processing section 240.

Upon this ACS calculation, the bit sequences forming the assembled sequence are already estimated. By this means, it is possible to limit the transition states at points corresponding to the assembled sequence. In the example shown in FIG. 9, the possible transition states at point tN are limited to the transition state 00. The possible transition states at the point tN−1 are limited to the transition states 00 and 01.

Further, the point t1 corresponds to the control information blocks outside the assembled sequence and therefore corresponds to unpredictable bits. The bits corresponding to point t1 are inputted in the encoder in a state where the assembled sequence is registered in the register group. Therefore, even if the bits corresponding to point t1 are unpredictable bits, the possible transition states at point t1 are limited to the transition states 00 and 01.

In FIG. 9, it is preferable to start the ACS calculation in surviving path calculation processing section 240 from point t0 (tN) at which the number of transition states are limited to be minimum by the predictable bits. By this means, the ACS calculation in surviving path calculation processing section 240 starts at t0, and the calculation is performed in the order of t1, t2, . . . , tN−1.

Thus, by limiting the transition states on a trellis diagram using estimated bit values and then performing ACS calculation, it is possible to find decoding characteristics equivalent to decoding characteristics of the termination coding scheme.

Here, limiting the transition states in a trellis diagram is equivalent to using the termination coding scheme and shortening the constraint length K. Therefore, even if repetitive processing is performed upon performing Viterbi decoding of a codeword after tail-biting convolutional coding like a conventional method, it is possible to reduce the amount of processing (specifically, the amount of processing upon trellis construction and the amount of traceback processing).

As preprocessing for the above-noted surviving path calculation processing in surviving path calculation processing section 240, prediction bit estimation processing and trellis calculation start position determination processing are performed.

[Prediction Bit Estimation Processing]

(1) Control Information Block Determined Uniquely Based on the Number of Retransmissions Predictable bit estimating section 220 estimates predictable bits based on the retransmission count information memorized in past information memory section 212.

Information determined uniquely based on the retransmission count information includes, for example, the above-noted NDI associated with the retransmission sequence number in (c), the redundancy version information in (d) and the transmission format identification information in (f).

The NDI associated with a retransmission sequence number is the information showing whether the transmission data sequence is new or retransmission, and, consequently, it is possible to predict the NDI based on whether or not the corresponding previous data is wrong, that is, based on the number of retransmissions zero (corresponding to new transmission) or the number of retransmissions one or more.

Further, redundancy version information is uniquely determined based on the number of retransmissions. Therefore, it is possible to estimate redundancy version information based on retransmission count information.

Further, in the case of a retransmitted data sequence, all bits of the bit sequences forming transmission format identification information are always known constant. Therefore, if the retransmission count information shows one or more, the transmission format identification information can be estimated uniquely.

(2) Control Information Block Showing a HARQ Process Number

Predictable bit estimating section 220 limits the HARQ process number included in the control information sequence based on the NACK transmission information memorized in past information memory section 212.

That is, receiving apparatus 200 does not receive the transmission data sequence and control information sequence associated with NACK transmission information (including HARQ process number and transmission timing information) before an RTT passes from the transmission timing of NACK. Therefore, it is possible to rule out the HARQ process number associated with this NACK transmission information, from candidates of the HARQ process number included in a control information sequence received before the RTT passes from the transmission timing of that NACK. As a result, it is possible to limit the transition states at the point corresponding to the control information block showing the HARQ process number.

(3) Control Information Block Including an Unused Bit Pattern, which is Not Used amongst Bit Patterns that Can Be Represented with the Number of Assigned Bits Predictable bit estimating section 220 limits the transition states at the point corresponding to a control information block, based on the unassigned bit pattern information memorized in unassigned bit pattern memory section 214.

That is, upon assigning two bits to the control information block showing modulation scheme identification information, and adopting QPSK (00), 16QAM (01) and 64QAM (10) as modulation schemes, predictable bit estimating section 220 can limit the transition states at the point corresponding to this control information block, to transition states other than 11.

(4) Control Information Block Storing ACK/NACK Identification Information

A system adopting ARQ is designed such that ACK is provided approximately 90 percent of the time. Therefore, predictable bit estimating section 220 limits the transition states at the point corresponding to this control information block, to the transition states associated with the ACK.

[Trellis Calculation Start Position Determination Processing]

As described above, the trellis calculation start position changes according to the position to which the transmitting side allocates an assembled sequence in control information blocks. This position to allocate the assembled sequence is determined in advance by information exchange and so on between transmitting apparatus 100 and receiving apparatus 200.

Therefore, trellis calculation start position determining section 230 determines the start point of the ACS calculation and such, based on allocation information of the assembled sequence.

As described above, according to the present embodiment, in transmitting apparatus 100, control information rearranging section 130 receives as input a control information sequence in which a plurality of control information blocks are arranged in a predetermined order, and forms a coding processing target sequence by rearranging the order of the plurality of control information blocks to form an assembled sequence grouping control information blocks comprised of predictable bit sequences in the plurality of control information blocks, and to allocate the assembled sequence to a predetermined position in the control information sequence. Further, encoding section 140 encodes the coding target sequence using the tail-biting convolutional coding scheme.

Thus, by forming an assembled sequence grouping control information blocks comprised of predictable bit sequences and allocating the assembled sequence to a predetermined position in the control information sequence, it is possible on the receiving side to realize decoding processing by the same processing as in the case of limiting the transition states corresponding to the assembled sequence and then using the termination coding scheme. As a result, it is possible to reduce repetitive processing required in conventional Viterbi decoding with respect to a codeword encoded using the tail-biting convolutional coding scheme, and suppress degradation of the accuracy of decoding at the ends of the decoded sequence due to truncation error.

Further, control information rearranging section 130 allocates the control information block of the highest importance in the control information blocks outside the assembled sequence, to the adjacency of the assembled sequence.

By this means, the control information block of the highest importance can be allocated to a position of good decoding characteristics, so that it is possible to improve the transmission characteristics of the control information block.

Further, in the above explanation, control information rearranging section 130 receives as input a control information sequence in which a plurality of control information blocks are arranged in a predetermined order, rearranges the order of the plurality of control information blocks to form an assembled sequence grouping control information blocks comprised of predictable bit sequences in the plurality of control information blocks, and allocates the assembled sequence to a predetermined position in the control information sequence to form a coding processing target sequence.

However, when control information generating section 120 generates a coding processing target data sequence including, in a predetermined position, an assembled data sequence grouping "bits that can be predicted on the receiving side", control information rearranging section 130 is not necessary.

That is, in transmitting apparatus 100, information acquiring section 142 needs to acquire a coding processing target data sequence including, in a predetermined position, an assembled data sequence grouping "bits that can be predicted on the receiving side" and convolutional coding section 144 needs to encode the coding target data sequence using the tail-biting coding scheme.

Here, the predetermined position to allocate the assembled data sequence grouping "bits that can be predicted on the receiving side", is preferably next to a known bit sequence such as padding bits.

Further, according to the present embodiment, in receiving apparatus 200 adopting a Viterbi decoding apparatus that decodes a coding data sequence encoded by the tail-biting coding scheme, predictable bit estimating section 220 estimates bit values of an assembled data sequence included in a coding data sequence and comprised of predictable bit sequences, surviving path calculation processing section 240 limits the transition states on a trellis diagram using the bit values estimated in predictable bit estimating section 220 and then calculates surviving paths by ACS calculation.

By this means, it is possible to realize the same decoding processing as in a case where the termination coding scheme is used. As a result, it is possible to remove repetitive processing required in the conventional Viterbi decoding with respect to a codeword encoded using the tail-biting convolutional coding scheme, and suppress degradation of the accuracy of decoding at the ends of the decoded sequence due to truncation error.

The invention claimed is:

1. A coding apparatus comprising:
a control information sequence forming section that forms a control information sequence in which two or more control information among a hybrid automatic repeat request process number, a new data indicator, and redundancy version information are consecutively arranged at a predetermined position in the control information sequence; and
a coding processing section that encodes the control information sequence using a tail-biting convolutional coding scheme.

2. The coding apparatus according to claim 1, wherein the control information sequence forming section forms the control information sequence such that the new data indicator is arranged after the hybrid automatic repeat request process number.

3. A coding apparatus comprising:
a control information sequence forming section that forms a control information sequence in which two or more control information among transmission format identification information, a new data indicator, a hybrid automatic repeat request process number, redundancy version information, and acknowledgement or negative acknowledgement identification information are consecutively arranged at a predetermined position in the control information sequence; and
a coding processing section that encodes the control information sequence using a tail-biting convolutional coding scheme.

4. The coding apparatus according to claim 3, wherein the control information sequence forming section forms the control information sequence such that the new data indicator is arranged after the hybrid automatic repeat request process number.

5. A coding apparatus comprising:
a control information sequence forming section that forms a control information sequence in which two or more control information among a hybrid automatic repeat request process number, a new data indicator, and redundancy version information are collectively arranged at a predetermined position in the control information sequence; and
a coding processing section that encodes the control information sequence using a tail-biting convolutional coding scheme.

6. The coding apparatus according to claim 5, wherein the control information sequence forming section forms the control information sequence such that the new data indicator is arranged after the hybrid automatic repeat request process number.

7. A coding method comprising:
a control information sequence forming step of forming a control information sequence in which two or more control information among a hybrid automatic repeat request process number, a new data indicator, and redundancy version information are consecutively arranged at a predetermined position in the control information sequence; and
a coding processing step of encoding the control information sequence using a tail-biting convolutional coding scheme.

8. The coding method according to claim 7, wherein the control information sequence forming step forms the control information sequence such that the new data indicator is arranged after the hybrid automatic repeat request process number.

9. A coding method comprising:
a control information sequence forming step of forming a control information sequence in which two or more control information among transmission format identification information, a new data indicator, a hybrid automatic repeat request process number, redundancy version information, and acknowledgement or negative acknowledgement identification information are consecutively arranged at a predetermined position in the control information sequence; and
a coding processing step of encoding the control information sequence using a tail-biting convolutional coding scheme.

10. The coding method according to claim 9, wherein the control information sequence forming step forms the control information sequence such that the new data indicator is arranged after the hybrid automatic repeat request process number.

11. A coding method comprising:
a control information sequence forming step of forming a control information sequence in which two or more control information among a hybrid automatic repeat request process number, a new data indicator, and redundancy version information are collectively arranged at a predetermined position in the control information sequence; and a coding processing step of encoding the control information sequence using a tail-biting convolutional coding scheme.

12. The coding method according to claim 11, wherein the control information sequence forming step forms the control information sequence such that the new data indicator is arranged after the hybrid automatic repeat request process number.

* * * * *